United States Patent
Simburger et al.

(10) Patent No.: US 7,709,729 B2
(45) Date of Patent: May 4, 2010

(54) THIN FILM SOLAR CELL INFLATABLE ULTRAVIOLET RIGIDIZABLE DEPLOYMENT HINGE

(75) Inventors: Edward J. Simburger, Agoura, CA (US); James H. Matsumoto, Los Angeles, CA (US); Thomas W. Giants, Santa Monica, CA (US); Alec Garcia, III, Santa Clarita, CA (US); Alan R. Perry, Conifer, CA (US); Suraj Rawal, Littleton, CO (US); Craig H. Marshall, Littleton, CO (US); John K. H. Lin, Middletown, DE (US); Jonathan Robert Day, Dover, DE (US); Thomas W. Kerslake, Strongsville, OH (US); Stephen E. Scarborough, Seaford, DE (US)

(73) Assignees: The Aerospace Corporation, El Segundo, CA (US); ILC Dover, LP, Frederica, DE (US); Lockheed Martin Corporation, Bethesda, MD (US)

( * ) Notice: Subject to any disclaimer, the term of this patent is extended or adjusted under 35 U.S.C. 154(b) by 1076 days.

(21) Appl. No.: 10/771,719

(22) Filed: Feb. 3, 2004

(65) Prior Publication Data
US 2005/0178426 A1    Aug. 18, 2005

(51) Int. Cl.
*H01L 31/042*    (2006.01)
(52) U.S. Cl. .................. 136/244; 136/256; 136/259; 136/292; 136/293; 244/158.3; 244/172.7; 244/172.8; 244/172.9; 244/159.5; 16/50; 16/66; 16/67; 16/68; 16/221; 16/373

(58) Field of Classification Search ......... 136/244–245, 136/292, 293, 259, 256, 59, 2; 244/172.7–172, 244/158, 158.3, 159.5, 35 R, 172.8, 172.9; 16/66–68, 211, 373, 50, 221
See application file for complete search history.

(56) References Cited

U.S. PATENT DOCUMENTS

| 3,277,479 | A | * | 10/1966 | Struble, Jr. ................ 342/8 |
| 3,960,386 | A | * | 6/1976 | Wallsten ................ 280/731 |
| 4,610,077 | A | * | 9/1986 | Minahan et al. ............ 438/68 |
| 5,701,067 | A | * | 12/1997 | Kaji et al. ................ 320/101 |
| 6,284,966 | B1 | * | 9/2001 | Simburger et al. ......... 136/244 |

OTHER PUBLICATIONS

Dever et al., "Indium Tin Oxide-Magnesium Fluoride Co-Deposited Films for Spacecraft Applications", International Conference on Metallurgical Coatings and Thin Films, Aug. 1998, 19 pages.*

(Continued)

*Primary Examiner*—Basia Ridley
*Assistant Examiner*—Thanh-Truc Trinh
(74) *Attorney, Agent, or Firm*—Ocean Law; Paul D. Chancellor (57) ABSTRACT

A flexible inflatable hinge includes curable resin for rigidly positioning panels of solar cells about the hinge in which wrap around contacts and flex circuits are disposed for routing power from the solar cells to the power bus further used for grounding the hinge. An indium tin oxide and magnesium fluoride coating is used to prevent static discharge while being transparent to ultraviolet light that cures the embedded resin after deployment for rigidizing the inflatable hinge.

13 Claims, 5 Drawing Sheets

OTHER PUBLICATIONS

Simburger et al., "Development, Design, and Testing of PowerSphere Multifuntional Ultraviolet-Regidizable Inflatable Structures", 44th AIAA/ASME/ASCE/AHS Structure, Structural Dynamics, and Materials Conference, Apr. 7-10, 2003, 11 pages.*

* cited by examiner

TOP CONTACT DEPOSITION

FIG. 1A

BOTTOM CONTACT DEPOSITION

FIG. 1B

CONTACT LASER WELD

FIG. 1C

WRAP AROUND CONTACT FABRICATION PROCESS

FIG. 2

FIG. 3A
INFLATABLE RIGIDIZABLE HINGE

FIG. 3B

INFLATABLE RIGIDIZABLE DEPLOYMENT HINGE MANUFACTURING PROCESS
FIG. 4

THIN FILM SOLAR CELL INFLATABLE ULTRAVIOLET RIGIDIZABLE DEPLOYMENT HINGE

STATEMENT OF GOVERNMENT INTEREST

The invention was made with Government support under contract No. NAS3-01115 by NASA. The Government has certain rights in the invention.

FIELD OF THE INVENTION

The invention relates to the field of thin film solar cell devices, manufacturing methods, and deployment means. More particularly, the present relates to the structure and fabrication processes for the formation of inflatable hinges for deployment of thin film solar cells for the collection and distribution of the collected solar power.

REFERENCE TO RELATED APPLICATIONS

The present application is related to a copending application entitled Thin Film Solar Cell Electrical Contacts, Ser. No. 10/420,461, filed Jul. 14, 2003.

BACKGROUND OF THE INVENTION

U.S. Pat. No. 6,127,621 entitled Power Sphere, U.S. Pat. No. 6,284,966 entitled Power Sphere Nanosatellite, U.S. Pat. No. 6,396,167 entitled Power Distribution System, U.S. Pat. No. 6,318,675 entitled Power Sphere Deployment Method, and U.S. Pat. No. 6,300,158 entitled Integrated Solar Power Module, all of which are hereby incorporated by reference, teach the use of solar cells for powering a spacecraft. The connections between individual serially connected solar cells and serial strings of solar cells have been accomplished by soldering or welding interconnect conductors to the front and back contacts of the solar cells. Solar cells use wire or wire mesh interconnects to connect individual solar cells in a series or to serially connect strings of solar cells to a spacecraft power bus. However, solder and mesh interconnections disadvantageously add significant mass to the thin film structure.

Thin film solar cells can be fabricated using monolithically integrated interconnections that eliminate the need for separate interconnect conductors for connecting a string of solar cells in series. Monolithically interconnected serial strings of thin film solar cells are readily available in commercial markets. Conventional thin film solar cells can be monolithically interconnected in thin film solar cell modules, but ultimately require connection to the spacecraft power bus disadvantageously using welding or soldering interconnects between the module and the power bus. The interconnects are typically made by soldering or welding methods to make electrical connections between the solar cells and the power bus. These welding and soldering methods of interconnection are not well suited for sensitive thin film structures due to excessive spot heat. That is, welding or soldering requires a high temperature to melt the solder or to weld a contact. This high temperature may be significantly higher than the maximum temperature that the thin film solar cell can withstand without damage during fabrication. Hence, another problem of connecting monolithically integrated thin film solar cells is the use of hot welding and soldering methods for interconnecting the thin film solar cells to the spacecraft power bus.

U.S. Pat. Nos. 6,284,966, and 6,318,675, and 6,127,621 teach stowing and deploying a stack of hexagons and pentagons to form a geodetic sphere as a power sphere spacecraft. The flat hexagonal and pentagonal panels are thin film solar cell panels that form a power sphere. Inflatable hinges are flexible tubular hinges used to precisely position the individual panels from a stowed position into final deployed positions forming the sphere of panels. One problem associated with flexible inflatable hinges is the need for routing power produced by the thin film solar cell panels across the hinges to the power bus.

The inflatable hinges are flexible for enabling inflation using sublimation powders for deploying space structures. The inflatable hinges do not form a rigid structure after the deployment is complete. It is desirable to rigidize the positions of the panels for accurately and rigidly forming the power sphere. Mechanical hinges can be used for rigidizing the position of the panels after deployment. However, mechanical deployment hinges disadvantageously add significant mass and control complexity to the spacecraft. Also, electrical conductors that cross the hinges are bundled together causing twisting and stresses that may lead to breakage of the conductors. Also, mechanical hinges disadvantageously require variable sizes to accommodate variable stacking thicknesses of the panels. These and other disadvantages are solved or reduced using the invention.

SUMMARY OF THE INVENTION

An object of the invention is to provide wrap around contacts for connecting a thin film solar cell to a flex circuit.

Another object of the invention is to provide wrap around contacts for connecting a thin film solar cell to a flex circuit using laser welding.

Yet another object of the invention is to provide a flexible inflatable hinge for rigidly positioning solar cell panels.

Still another object of the invention is to provide a flexible inflatable hinge for rigidly positioning solar cell panels and for interconnecting solar cells to a system power bus through flex circuits.

A further object of the invention is to provide a flexible inflatable hinge for rigidly positioning solar cell panels and for interconnecting the hinge to system ground bus through flex circuits.

In a first aspect, the invention is directed to a wrap around contact for providing electrical connections between a thin film solar cell contact and electrical conductors in a flex circuit for routing electrical energy produced by the solar cells to a power bus. The wrap around contact fabrication method forms electrical connection between the current collecting conductors of a monolithically interconnected thin film solar cell panel and a flex circuit used for routing a power conductor and a ground conductor from the solar cells. The wrap around contact is preferably made of copper for conducting electrical current.

In a second aspect, the invention is directed to a flexible inflatable hinge that includes curable resin for rigidly positioning panels of solar cells about the hinge at precise angular displacements from each other. In the preferred form, the wrap around contact and flex circuit are disposed in the hinge for routing power from the solar cells to external power conversion electronics. A transparent coating is used to prevent static discharge while being transparent to ultraviolet light that cures the embedded curing resin for rigidizing the inflatable hinge after deployment. The flex circuit is also preferably routed to a plurality of ground pads for electrical grounding the inflatable hinge at various locations about the hinge to prevent static discharge. These and other advantages will become more apparent from the following detailed description of the preferred embodiment.

DETAILED DESCRIPTION OF THE PREFERRED EMBODIMENT

An embodiment of the invention is described with reference to the figures using reference designations as shown in the figures. Referring to FIGS. 1A, 1B, 1C, and 2, a solar cell panel includes a thin film solar cell having a top silver contact and a polyimide substrate. The electrical connection between the thin film solar cells and the flex circuit is made by depositing a wrap around contact through shadow masks. The wrap around deposition covers in part the top, bottom, and side of the solar cell panel. A top contact made of copper is deposited through a shadow mask on to the edge of the panel covering in part the solar cell silver contact and the side edge of the solar cell panel. After depositing the top contact on the side of the panel, the shadow mask is removed. The panel is flipped and a second shadow mask is installed for depositing a bottom contact made of copper covering in part the polyimide substrate and the side of the top contact, after which the second shadow mask is removed. The bottom contact and top contact form a wrap around contact covering in part the solar cell silver contact, the side edge of the panel, and polyimide substrate.

The flex circuit comprises thin film insulating layers and conductive trace layers that are fabricated one layer at a time. The flex circuit has copper conductor traces. The conductor traces can be etched in the shape of a weld pad. Preferably, the bottom sheet of the flex circuit is a polyimide sheet, for example, a sheet of Kapton, with a portion removed locally around the weld pad. This is accomplished as an initial step during construction of the flex circuit. Once the insulating material is removed from the weld area, a copper film can be bonded to the insulating sheet. The copper film is then etched to create the weld pads and conductor traces. An additional cover polyimide layer, not shown, may also be bonded on top of the flex circuit to cover the conductor traces. Both insulating polyimide layers have the same portion removed around the weld area so that the copper conductor trace is exposed on both sides of the flex circuit for direct welding to the wrap around contact. A laser wire stripper can also be used to specifically remove the portion of the insulating sheet around the weld area.

Figure 1A:
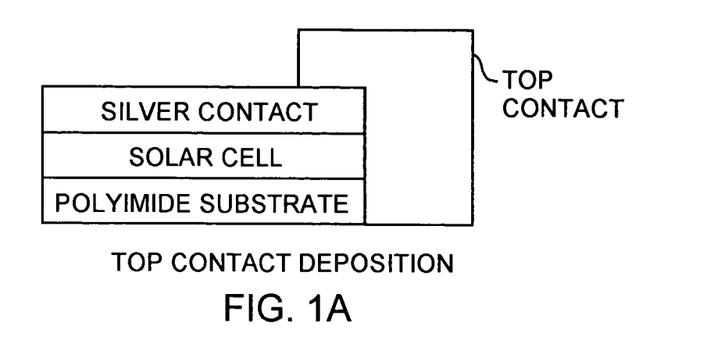
FIG. 1A is a diagram of top contact deposition.
Figure 1B:
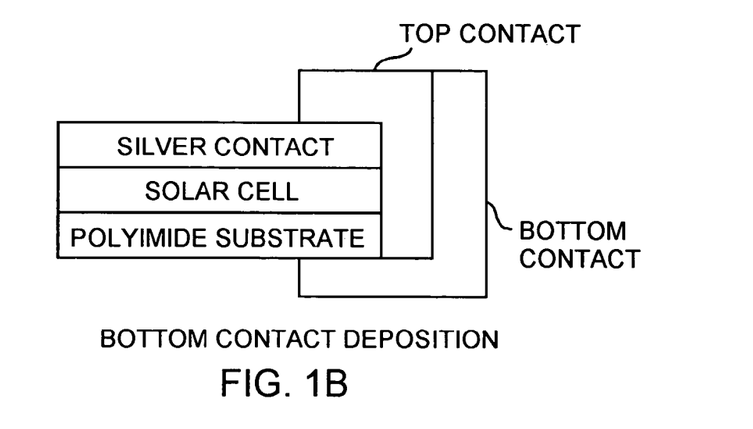
FIG. 1B is a diagram of bottom contact deposition.
Figure 1C:
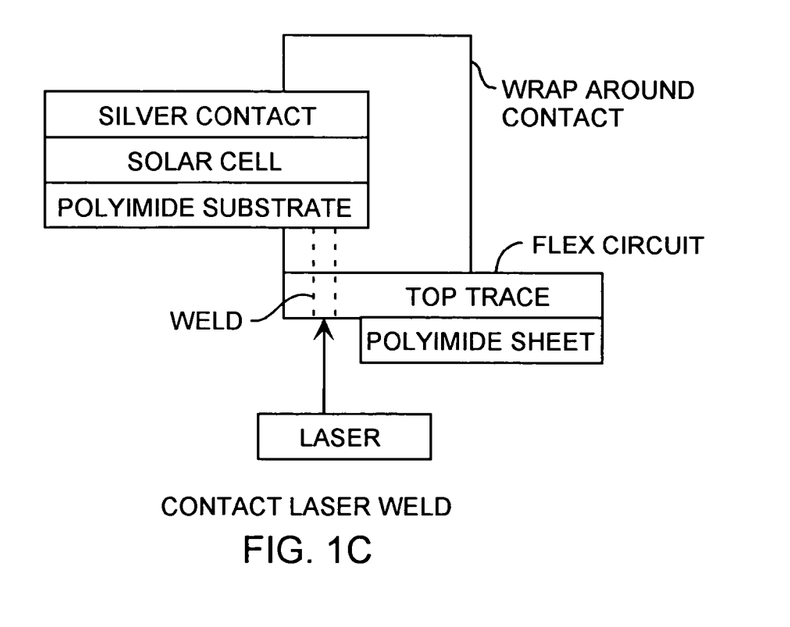
FIG. 1C is a diagram of a contact laser weld.
Figure 2:
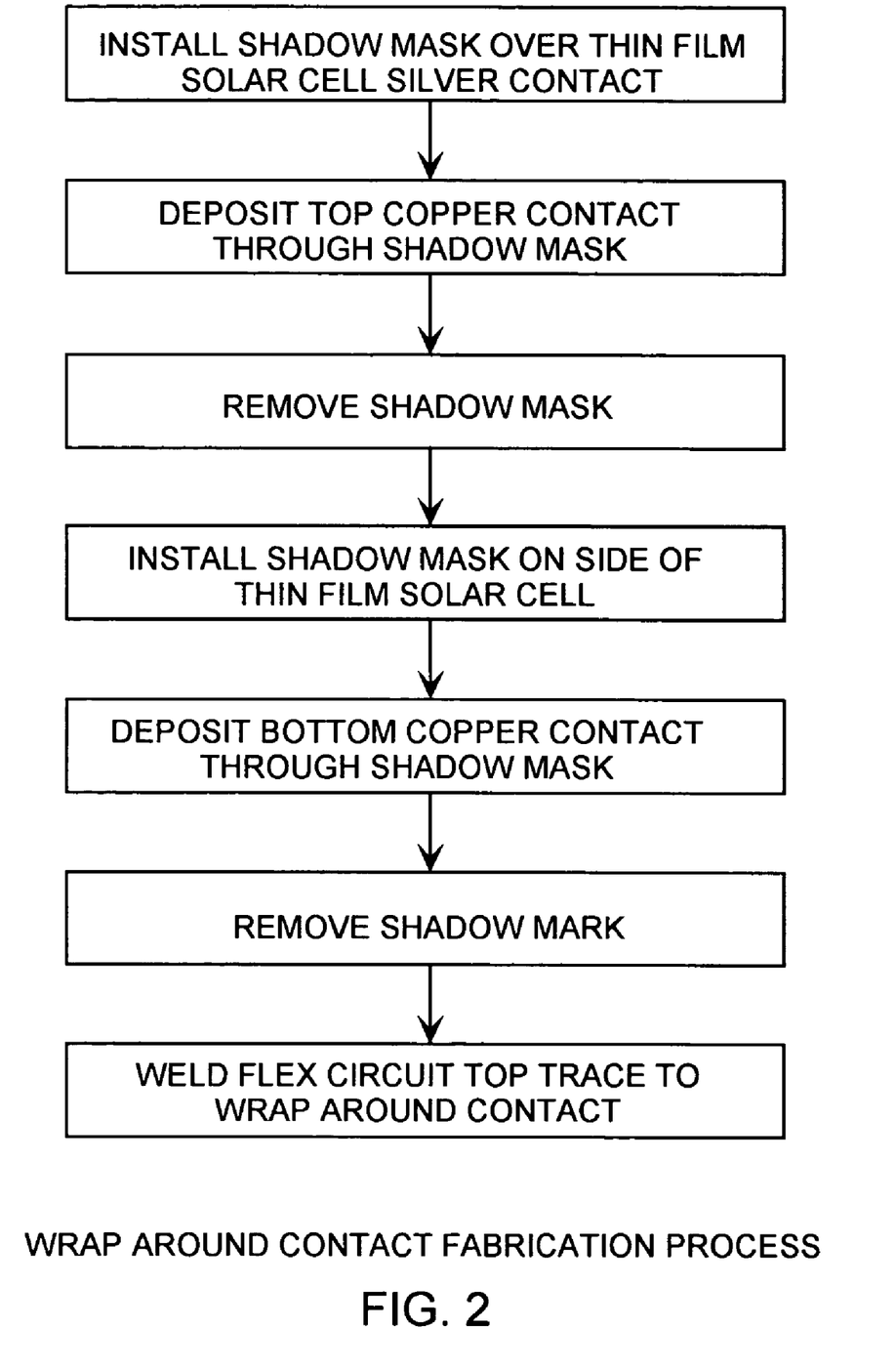
FIG. 2 is flow diagram of a wrap around contact fabrication process.

The flex circuit having an exposed top conductor trace of copper is then laser welded to the wrap around contact. The laser weld serves to bond the flex circuit to the solar cell panel. The laser weld further serves to electrically connect the top trace of the flex circuit to the wrap around contact and to the solar cell silver contact so as to electrically connect the flex circuit to the solar cell contact. The laser weld is created by focusing a laser beam on the exposed trace that is abutting the wrap around contact in the weld area so as to weld together the top trace and the wrap around contact. The wrap around contact provides power and ground bus connections between silver contacts on the thin film solar cell to flex circuit. The flex circuit is preferably made of a separate sheet of polyimide with etched top copper conductor traces deposited on or bonded to the insulating polyimide sheet. The polyimide sheet can also be formed from several polyimide insulating layers with embedded conductor traces.

Vapor deposition is used to deposit the top and bottom copper contacts of the wrap around contact on the edge of the thin film solar cell. The flex circuit traces are deposited on or bonded to the polyimide sheet. To provide additional bonding strength, the flex circuit can be adhesively bonded to the solar cell panels. Portions of the polyimide sheet can also be bonded with an adhesive to the back of the thin film solar cell on the polyimide substrate such that the flex circuit trace and the wrap around contact would make a metal-to-metal contact for laser welding. A laser welder would then be used to spot-weld the wrap around contact and the flex circuit top conductor trace for providing an electrical connection. The integrated flex circuit routes power from each solar cell to the spacecraft power conversion electronics, not shown.

Preferably, the flex circuit is sized or patterned so that the top trace extends past the edge of the polyimide layer. The top trace conductor is then exposed for direct illumination by the laser beam for directly welding the top conductor trace to the bottom side of the wrap around contact. In so doing, the laser does not burn through the polyimide sheet thereby preventing the generation of carbon debris that might otherwise contaminate the laser spot weld between the wrap around contact and the top conductor trace. Various methods can be used to trim the polyimide sheet of the flex circuit so as to expose the top conductor trace. Such methods may include patterned polyimide layer generation, such as patterned holes in the polyimide sheet. Laser wire stripping or mechanical cutting can be used as well for trimming the polyimide layer to expose the top conductor trace for direct laser spot welding.

Figure 3A:
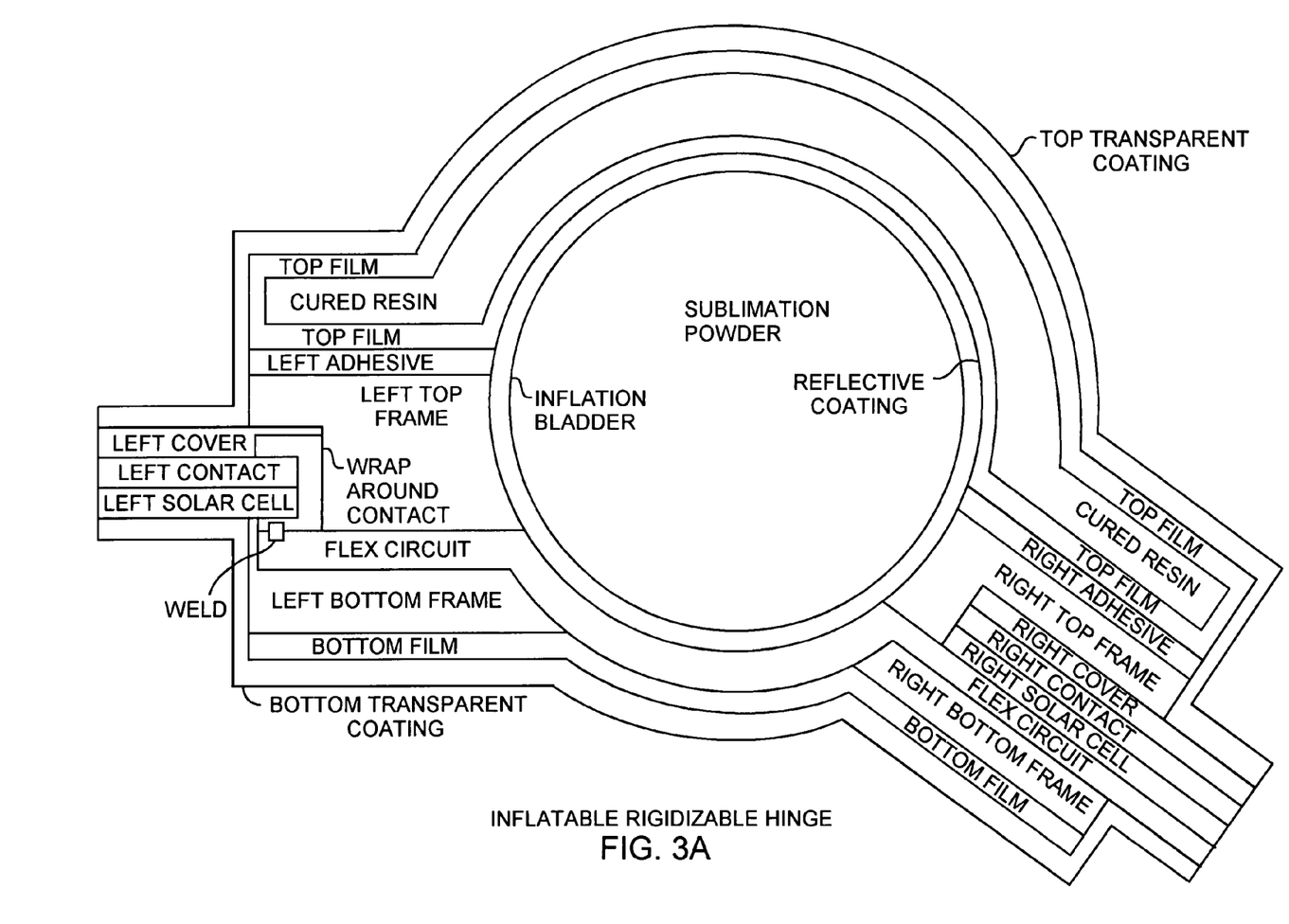
FIG. 3A is a sectional diagram of an inflatable rigidizable hinge.
Figure 3B:
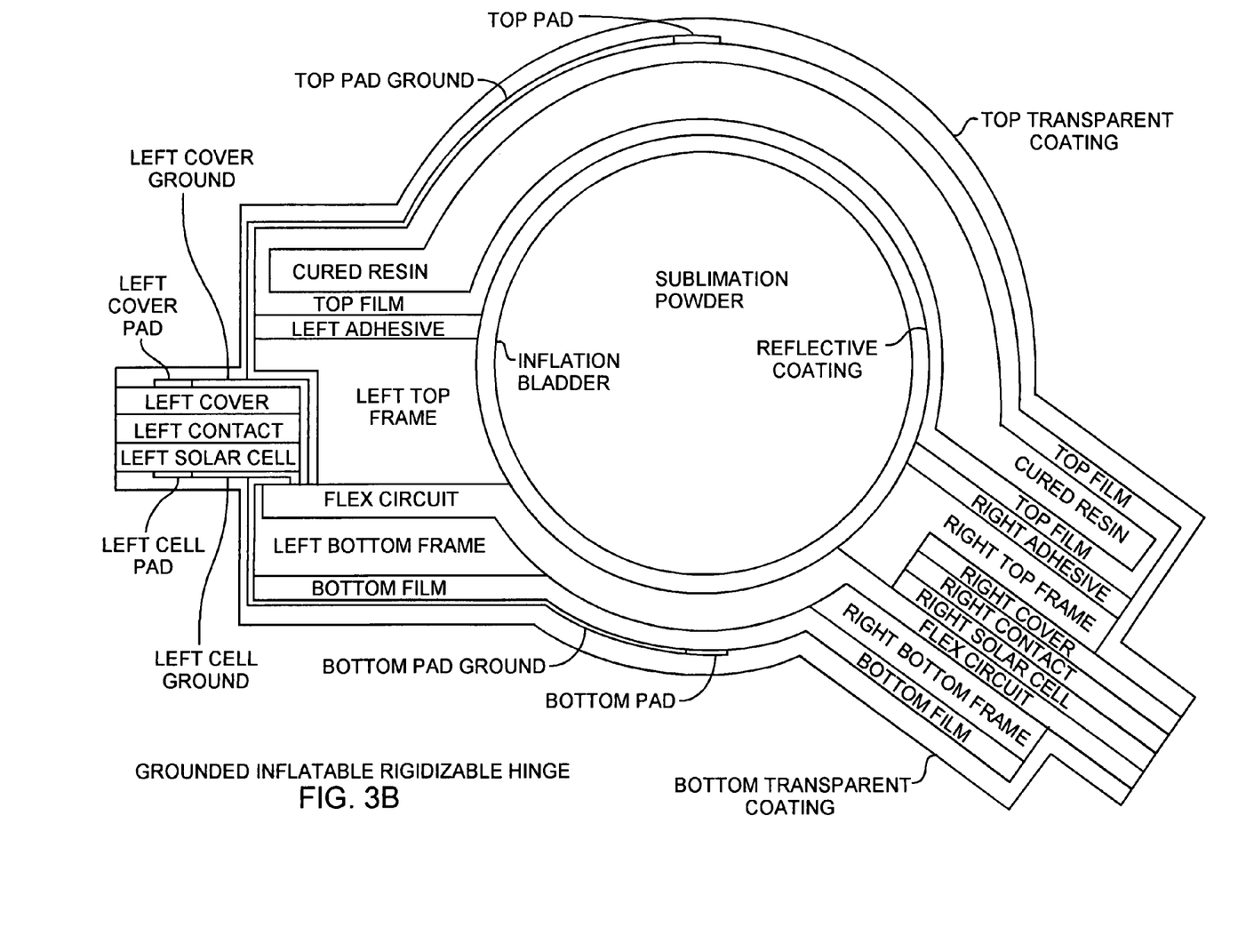
FIG. 3B is a sectional diagram of a grounded inflatable rigidizable hinge.
Figure 4:
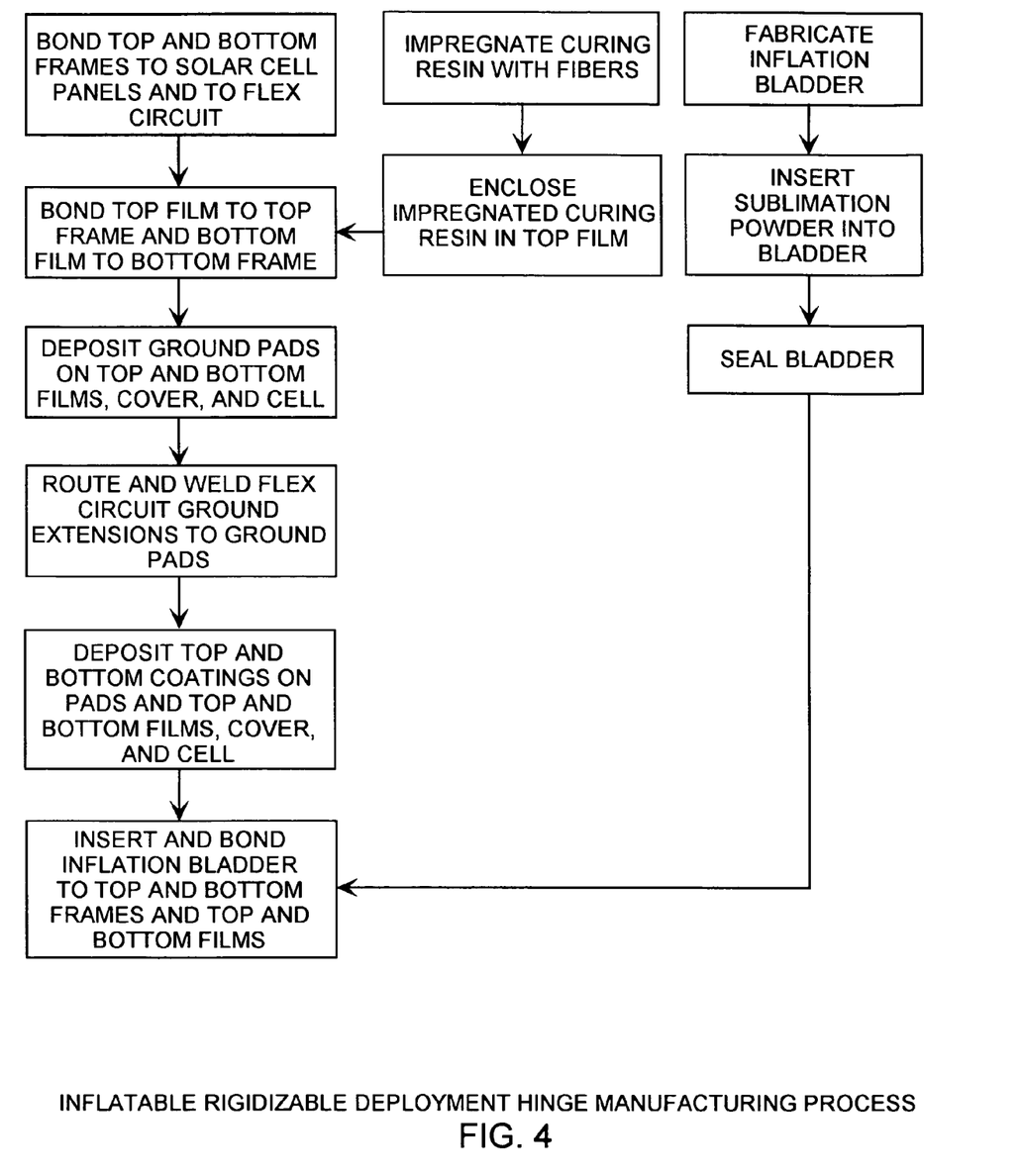
FIG. 4 is a flow diagram of a wrap around contact fabrication process.

Referring to all of the Figures, and more particularly FIGS. 3A, 3B, and 4, the solar cell panel assembly including the solar cell panel, wrap around contact, and flex circuit can be used in an inflatable rigidizable hinge. The hinge is an elongated hinge extending between the solar cell panels. The hinge is shown in two cross-sectional views for convenience. The hinge can be used, for example, to position two solar cell panels in relative positions to each other. Such hinges and panels can be used to form a power sphere nanosatellite. A left side panel, includes a left thin film solar cell comprising the left solar cell with a left polyimide substrate and with a left silver contact, and includes a left cover layer that is deposited over thin film solar cell. The left panel is laser welded to the flex circuit at a proximal end. A right side panel, includes a right thin film solar cell comprising a like right solar cell with a right polyimide substrate, and a right silver contact, and includes a right cover layer that is deposited over the right thin film solar cell. The hinge is used to relatively position right and left panels while enabling electrical connection from the left panel, through the flex circuit, and along the right panel to the power conversion electronics, not shown. The flex circuit can be a continuous sheet having many parallel traces extending along several panels with respective wrap around contacts for interconnecting the panels to the conversion electronics. As such by one example, the flex circuit is laser welded to the left panel. As such, power and grounds conductors can be routed through the flex circuit for routing power from the solar cell panels. Hence, the flex circuit becomes an integral part of the hinge. The left Frame is shown as top and bottom left frames that are bonded to the left panel. A right Frame is shown as top and bottom right frames bonded to the right panel. The frames are panel supports that resist flexing of the panels during use, and extend around the edges of the respective panels, as well as through the hinge. The flex circuit is disposed between the top and bottom left frames that are bonded together as the left frame, and between top and bottom right frames that are also bonded together as the right frame, for routing and securing the flex circuit to the respective left and right panels within the respective left and right frames. A top film is formed as an overlapped and elongated pocket, running the elongated length of the inflation bladder. A curing resin is disposed in the elongated pocket of the top film. The resin is impregnated with glass fibers for improved strength. Preferably, a sheet of glass fibers is impregnated with a curing resin and inserted into the elongated pocket of the top film. In an uncured state, the resin in inserted and enclosed into the top film that is then thermally sealed. The rigidization curing material in the top film may actually be 449 1250 S-2 glass fibers impregnated with ATI-P600-2 UV curable epoxy resin. The stiffness, strain to failure, environmental resistance, thermal conductivity, and coefficient of thermal expansion are properties considered for the fibers. The coefficient of thermal expansion is important in developing a near zero coefficient of thermal expansion structure that would not suffer shape changes from variable thermal inputs on the structure. Carbon, Kevlar, and Vectran all exhibit low or negative coefficients of thermal expansion. S-glass fibers have a low coefficient of thermal expansion of $1.6 \times 10^{-6}$ ppm/° C. An E-glass fiber has a slightly higher coefficient of thermal expansion $5.4 \times 10^{-6}$ ppm/° C. The resin has a glass transition temperature of 211° C., well above operational temperatures. The resin can be cured from UV energy from the sun in approximately ten to forty-five minutes depending on shadowing effects, material thickness, and the UV transparency of the top film. The uncured resin is heated, for example by sun light, to at least −20° C. prior to curing by UV sun light exposure. The top film is bonded to top left and right frames. A bottom film is then bonded to the bottom left and right frames. The top and bottom films are preferably bonded to the left and right frames using, for example, an adhesive, such as the left and right adhesives disposed between the top left and right frames and the top film. The top and bottom films are flexible films, and form flexible elements of the hinge. The flex circuit is integrated with the thin film solar cell panel and incorporated into the hinge between the bladder and the bottom film.

After securing the top and bottom films to the top and bottom of the left and right frames, flex circuit ground extensions are routed to various positions about the top and bottom films for distributed grounding. The flex circuit provides the electrical conduction path for electric power generated by the thin film solar cell, and any associated instrumentation, electronics, or sensors, not shown. The flex circuit also provides the electrical grounding path for the transparent coatings covering the hinge. As shown in FIG. 3B, ground pads are deposited on the solar cell panels, such as a left cover pad on the top of the left panel, and a left cell pad deposited on the bottom of the left solar cell of the left thin film solar cell panel. Ground pads are also deposited on the top and bottom films, such as the top pad and bottom pad, as shown. Four flex circuit ground extensions, also made from a polyimide sheet and conductor copper traces, are routed to respective ground pads. The four flex circuit ground extensions are also disposed between the left and right frames for securing the flex ground extensions. The four flex circuit ground extensions include a top pad ground flex circuit extension routed to the top pad on the top film, a bottom pad ground flex circuit extension routed to the bottom pad, a left cover ground flex circuit extension routed to the left cover pad, and a left cell ground flex circuit extension routed to the left cell pad. The flex circuit extension include a ground top trace, not shown, that can be laser welded to a respective ground pad, so as to route electrical ground through the ground bus in the flex circuit to all of the ground pads for distributively grounding of the hinge. A top coating is deposited over the top film and over the left and right solar cell panels. A bottom coating is deposited over bottom film and over the bottoms of the left and right solar cell panels. The top and bottom transparent coatings are transparent to ultraviolet light for curing the resin after deployment of the hinge. The coating is conductive and distributively grounded for preventing electrostatic discharge and build up about the hinge. The coating is conductive and is deposited to make conductive contact with four ground pads so as to distributively ground the top and bottom coatings. The coating is a composite material made of indium tin oxide and magnesium fluoride ($ITO/MgF_2$). The $ITO/MgF_2$ transparent coatings provide ultraviolet transparency and electrical conduction about the nonconductive surfaces of the top and bottom films. The $ITO/MgF_2$ top and bottom transparent coatings are UV transparent to allow ultraviolet radiation from the sun to cure the resin once the hinge is deployed. The top and bottom transparent coatings are also transparent to visible light for enabling solar power collection by the thin film solar cells. The $ITO/MgF_2$ transparent coating provides protection from atomic oxygen for polymer based films components. The $ITO/MgF_2$ coating contains 9% $MgF_2$ and is preferably at least 500 angstroms thick to provide adequate protection from atomic oxygen erosion of the protected surfaces, yet thin enough to enable UV transparency.

The top and bottom transparent coatings allow UV sunlight to pass through the coatings and top film in order to cure the curing resin in the desired wavelengths, such as, below 385 nm. To assist in the curing process, it is desirable to have vapor deposited reflective coatings on the bladder. The reflective coatings are preferably made of vapor deposited aluminum. The reflective coatings on the bladder will reflect a percentage of UV light back into the curing resins.

The top and bottom films have the ability to be packed tightly without tearing or pin holing. The top and bottom films have low permeability to a variety of chemicals. In addition, the films have low elongation properties so that the inflated shape forms to the desired cure shape. The top and bottom films are made of polymer materials that enable thermally welded sealing. Such polymer material may be Mylar and Kynar. Mylar is a polyester film, is UV transmissive, moderately flexible, strong, but at times difficult to thermally weld. Kynar is made from polyvinylidene fluoride (PVDF), is moderately flexible, strong, and can be thermally welded. The polyvinylidene fluoride films are preferred as a UV transparent flexible film that can also be thermally welded. The top and bottom films are preferably made of Mylar LBT-2 or Kynar 740 having strong and reliable welded seams.

The bladder is preferably made of Mylar MC2 that is coated with a 0.001 inch thick vapor deposited aluminum reflective coating. The coated bladder film is then over coated on both sides with polyvinylidene chloride (PVDC) in order to allow the bladder to be thermally welded for sealing and encapsulating the inflation material. The inflation bladder is fabricated into the form of an elongated flexible tube in which is disposed an inflation material, such as the sublimation powder. The elongated flexible tubular bladder is then sealed so as to contain the sublimation powder within the inflation bladder. The inflation bladder is inserted between the top and bottom films and then bonded to the top and bottom films and to the left and right frames, for forming the inflatable hinge. The left and right frames provides support for the solar cell panels, stabilizes the flex circuit, provides a rigid support for the inflation bladder, and provides a rigid support for the top film encapsulating the uncured resin. The inflation material is inserted into the bladder prior to thermal sealing.

The inflation material in the bladder provides a vaporization inflation system. The inflation material can be a powder, a solid, or a liquid inserted into the bladder during fabrication. Sublimation or vaporization of the inflation material will transition the material to the gas phase as the external pressure on the hinge inflation bladder transitions from one atmosphere to the vacuum in space. When the hinge is released when on-orbit in space, the inflation material will continue to transition to the gas phase to maintain equilibrium pressure within the inflation bladder. This pressure provides the mechanical force necessary to inflate the bladder to deploy the hinge and to hold the deployed hinge in the desired deployed position while the ultraviolet sunlight cures the curing resin. The hinge is inflated to approximately one psi. The maximum allowable pressure of the bladders is limited by seam strength. Due to the small radius of the hinge, the hinge can withstand a high pressure. The maximum pressure and temperature for the hinge is at most 22.5 psi at 80° C. The inflation material is preferably a mixture of trimethylpentane and hexane that has a maximum pressure limit of 22.5 psi, has good material compatibility, and is inexpensive. This mixture has a vapor pressure equal to the minimum pressure, 0.5 psi, at −11° C. The low temperature deployment for the hinges is limited to −11° C.

The size of the hinge can be varied as desired. Using templates for sizing the top and bottom films, the panel angular displacement can be, for example, 41.8±2 degrees. The bottom film is a single layer of film whereas the top film is folded and sealed to form a pocket for the curing resin. The width of the top and bottom films span the length of the cylindrical portion of the bladder bonded to the frames. The top film circumferential length is preferably longer than the bottom film. The difference in the circumferential lengths of the top and bottom films provides the proper angle of the panels upon inflation. The diameter of the hinge is dependent on the maximum stack height of the panels. The circumferential length of the bottom film must be enough to span the stack height of two solar cell panels. The bonding of the bladder, top film, and bottom film to the frames maintains the accuracy of the hinge angle.

The design of the hinge and the left and right frames should be optimized according to the rotational requirement. The rotational requirement may be, for example, 4 to 60 rpm. Based on the maximum rotational speed requirement and the maximum deflection 1.0 centimeter at an edge of a panel, the section modulus of the hinge should be greater than $7.6 \times 10^{-10}$ $m^4$ and the section modulus for the left and right frames should be greater than $1.0 \times 10^{-10}$ $m^4$. The cured hinge stiffness is sufficient to withstand the centripetal force caused by a spinning satellite system such that the deflection of the hinge is within acceptable geodetic shape limits of a power sphere. The UV rigidization resin material is encased in the top film to mitigate outgassing.

The hinge can be made of various materials and used to support differing types of panels. In the preferred form, the hinge supports opposing thin film solar cell panels using flexible materials. An adhesive, for example, can be used for bonding together the top and bottom films, left and right frames, and the inflation bladder. The curing resin is preferably an epoxy impregnated S-glass fiber curing resin, but other UV curing resin materials can be used, with or without reinforcing fibers. The cured reinforced resin provides structural rigidity after deployment of the hinge and after exposure to ultraviolet light, such as from the sun, in the case of the power sphere. The curing resin provides flexibility for stowing the hinge in a compressed compact form prior to deployment, and provides structural rigidity after deployment and after UV light exposure when the hinge becomes rigid on-orbit. Once cured on-orbit, the hinge becomes completely rigid and provides zero mechanical backlash.

The hinge is preferably part of a complete deployment system, including a center column in a power sphere, not shown. The hinges are packed into a small stowage volume prior to launch. The center deployment column can also be an inflatable UV rigidizable isogrid boom consisting of a grid work of UV curable composite tows integrated into an airtight, UV transparent, thin film. A flex circuit can be integrated into a bladder of the column wall. The center column is flexible in the uncured state for compact z-fold packing. The use of the flex circuit in conjunction with UV rigidizable resin material allows for efficient packing for stowage prior to launch. The length of the center column is sized to the specific geodetic sphere for proper alignment of top and bottom hemispheres. After inflation, UV radiation will cure the resin in the center column to rigidize the center column.

The invention in a first aspect is directed to a wrap around contact for interconnecting a solar cell panel to a flex circuit. The invention in a second aspect is directed to an inflatable hinge having an inflation bladder containing an inflation material and a film encapsulating a curing resin for rigidizing the hinge after inflation of the inflation bladder and after being cured using UV light passing through a UV transparent coating. The wrap around contact can be used for interconnecting solar cell panels through the inflatable hinge. Those skilled in the art can make enhancements, improvements, and modifications to the invention, and these enhancements, improvements, and modifications may nonetheless fall within the spirit and scope of the following claims.

What is claimed is:

1. A hinge for positioning a left panel and a right panel, the hinge comprising,
   an inflatable bladder for encapsulating an inflation material,
   a top film extending between the left and right panels, and
   a bottom film extending between the left and right panels, the top film and bottom film are circumferentially disposed about the bladder, the top film having a top circumferential length, the bottom film having a bottom circumferential length, the top and bottom circumferential lengths for angularly positioning the left and right panels as the inflatable bladder is inflated
   uncured resin disposed between the top and bottom films, wherein the uncured resin is configured to be cured after deployment of the hinge and by exposure to UV light,
   a flex circuit extending from the left panel and around the bladder for electrically routing power from the left panel, wherein the left panel is a solar cell panel comprising a silver contact and a thin film solar cell, wherein the flex circuit comprises a conductor trace connected to the silver contact for routing power from the left panel and around the bladder.

2. The hinge of claim 1 wherein,
   the inflation material is a sublimation powder disposed in the bladder for inflating the bladder.

3. The hinge of claim 1 further comprising,
   a reflective coating disposed on the bladder for reflective UV light into the uncured resin for curing the uncured resin to rigidize the hinge to secure in position the top and bottom film for permanently securing in position the left and right panels.

4. The hinge of claim 1 further comprising,
a left frame for securing the left panel to the top film and to the bottom film and to the bladder, and
a right frame for securing the right panel to the top film and to the bottom film and to the bladder.

5. The hinge of claim 1 further comprising,
a left frame for supporting the left panel to the top film and to the bottom film and to the bladder,
a left adhesive layer for securing the left frame to the left panel and to the top film and to the bottom film and to the bladder,
a right frame for supporting the right panel to the top film and to the bottom film and to the bladder, and
a right adhesive layer for securing the right frame to the right panel and to the top film and to the bottom film and to the bladder.

6. The hinge of claim 1 further comprising,
a plurality of ground pads disposed on the top and bottom films,
a plurality of extensions comprising conductive traces extending from the flex circuit to the plurality of ground pads, respectively, for distributively grounding the hinge.

7. The hinge of claim 1 further comprising,
a plurality of ground pads disposed on the top and bottom films and disposed on and under the left and right panels, and
a plurality of extensions comprising conductive traces extending from the flex circuit to the plurality of ground pads, respectively, for grounding the hinge.

8. The hinge of claim 1 wherein the sun ejects electrons producing a static electrical charge and the sun emits UV light exposing the hinge to UV light and a static electrical charge, the hinge further comprising,
a coating disposed over the top and bottom films for passing UV light and for conducting a static electrical charge, the coating serving to discharge a static electrical charge accumulating on the coating, the UV light curing the uncured resin to rigidize the hinge to secure in position the top and bottom film for permanently securing in position the left and right panels.

9. The hinge of claim 1 wherein, the sun ejects electrons producing a static electrical charge and the sun emits UV light exposing the hinge to UV light and a static electrical charge and, the hinge further comprising,
a transparent coating disposed over the hinge for passing UV light and for conducting a static electrical charge, the coating comprising indium tin oxide and magnesium fluoride, the transparent coating serving to discharge a static electrical charge accumulating on the transparent coating, the UV light curing the uncured resin to rigidize the hinge to secure in position the top and bottom film for permanently securing in position the left and right panels.

10. The hinge of claim 1 wherein the left panel is a solar cell panel for providing power, the hinge further comprising,
a wrap around contact for electrically connecting the electrical contact and the trace conductor.

11. A hinge for positioning a left panel and a right panel, wherein the sun ejects an electrical charge producing a static electrical charge and the sun emits UV light exposing the hinge to UV light and a static electrical charge, the hinge comprising,
uncured resin,
a top film for encapsulating the uncured resin, the uncured resin being cured by exposure to UV light, the top film having a top circumferential length for defining a position between the left and right panels, wherein the uncured resin is configured to be cured after deployment of the hinge and by exposure to UV light;
a coating disposed over the top film for passing the UV light for curing the uncured resin and for static discharge protection of the top film, the coating serving to discharge a static electrical charge accumulating on the coating, the UV light curing the uncured resin to rigidize the hinge to secure in position the top film for permanently securing in position the left and right panels
a bladder filled with a sublimation powder for expanding the bladder, and
a flex circuit extending from the left panel and around the bladder for electrically routing power from the left panel, the left panel being a solar cell panel comprising a silver contact and a thin film solar cell, the flex circuit comprising a conductor trace connected to the silver contact for routing power from the left panel and around the bladder.

12. The hinge of claim 11, the hinge further comprising,
a bottom film, the top film and bottom films are circumferentially disposed about the bladder, the bottom film having a bottom circumferential length, the top and bottom circumferential length defining the position between the left and right panels when the bladder has expanded.

13. The hinge of claim 11, wherein,
the coating comprises indium tin oxide and magnesium fluoride.

* * * * *